Sept. 4, 1951 C. W. CLAPP 2,566,981
LOW-DISTORTION OSCILLATOR
Filed July 20, 1949
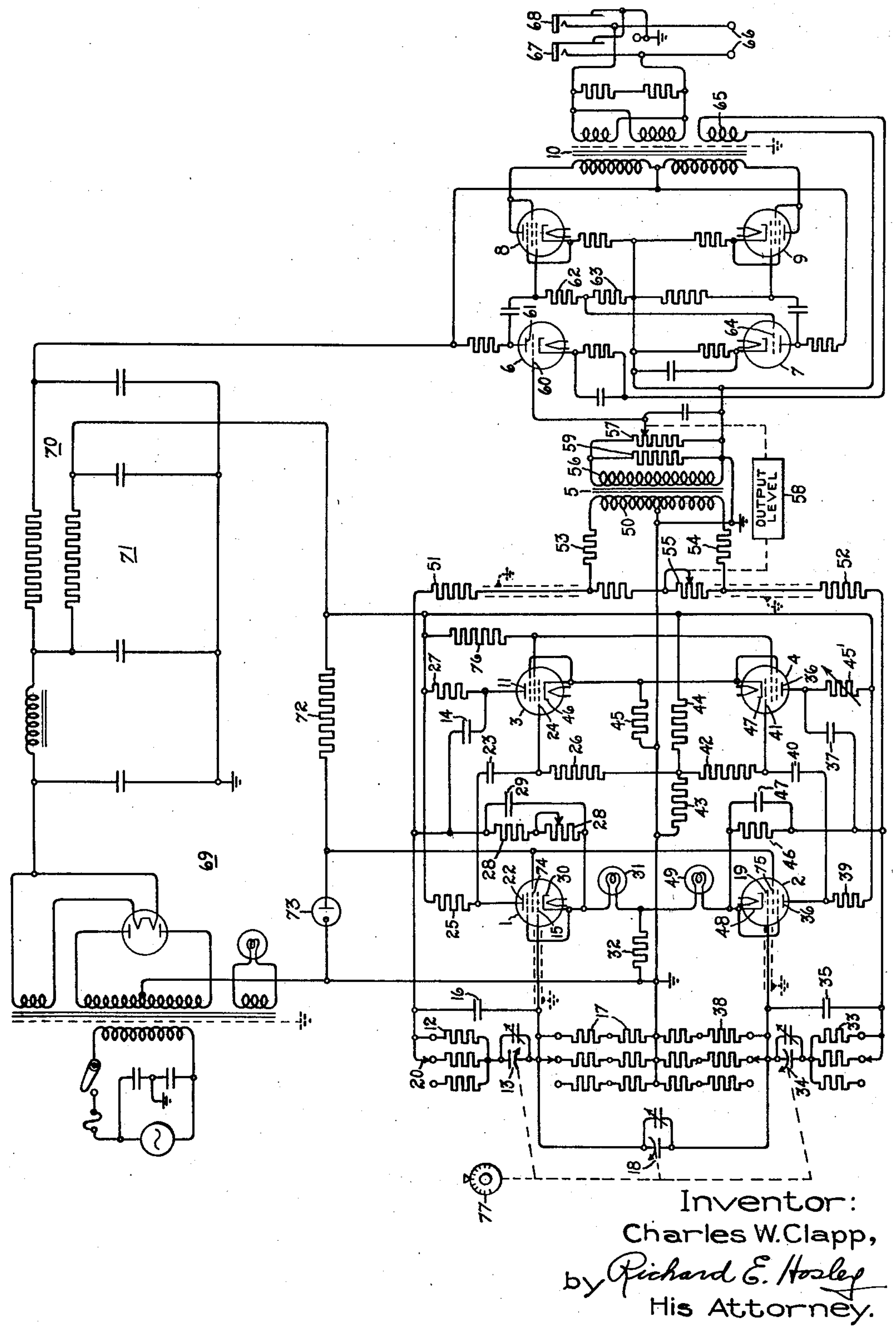
Inventor:
Charles W. Clapp,
by Richard E. Hosley
His Attorney.

Patented Sept. 4, 1951 2,566,981

UNITED STATES PATENT OFFICE 2,566,981

LOW-DISTORTION OSCILLATOR

Charles W. Clapp, Scotia, N. Y., assignor to General Electric Company, a corporation of New York Application July 20, 1949, Serial No. 105,845

10 Claims. (Cl. 250—36)

My invention relates to low-distortion oscillators, and particularly to resistance-capacity electronic oscillators.

An object of my invention is to provide an electronic oscillator of improved operating characteristics.

A further object of my invention is to provide a simple oscillator comprising a minimum of components operable to furnish an output signal comprising a minimum of distortion or spurious components.

A specific object of my invention is substantially to reduce the necessary value of, and the number of, main tuning capacitors in a resistance-capacity oscillator tunable over a predetermined range of frequencies.

In accord with my invention, the desirable features of an oscillator in which amplitude is stabilized by a negative feed-back circuit comprising a non-linear impedance element are retained while harmonic distortion components are greatly reduced. My invention also provides increased stability of oscillations.

The novel features which I believe to be characteristic of my invention are set forth with particularity in the appended claims. My invention itself, however, both as to its organization and method of operation, together with further objects and advantages thereof may best be understood by reference to the following description taken in connection with the accompanying single figure of the drawing, which is a circuit diagram of an oscillator in accord with my invention.

As shown in the drawing, an oscillator according to my invention comprises a pair of push-pull connected Wien bridge circuits, associated respectively with the control electrode circuits of discharge devices 1, 2. The Wien bridge circuits are arranged to provide positive or regenerative feedback of the anode signal of each of devices 1, 2 to the control electrodes. Amplifier devices 3, 4 are arranged to amplify and reverse the phase of these signals prior to furnishing such signals to the respective feed-back paths. The amplified signals are also furnished to the primary winding of push-pull to single ended transformer 5, which in turn has a single ended secondary winding connected to a phase splitting and amplifying circuit comprising discharge devices 6, 7. The push-pull signal from this circuit is applied to a pair of push-pull connected amplifier devices 8, 9 from which the output signal is obtained through transformer 10.

The frequency of oscillation in the oscillator is primarily determined by the values of the resistors and capacitors of the push-pull connected Wien bridge networks associated with devices 1, 2. Each of these networks includes a positive feedback path, and in one network this path, from the anode 11 of device 3, comprises a resistor 12 and variable capacitor 13. The resistor 12 is coupled to anode 11 through a coupling capacitor 14, and the signal appearing on anode 11 is supplied through resistor 12 and capacitor 13 to the control electrode 15 of device 1. Resistor 12 and capacitor 13 are shunted by a fixed capacitor 16. Due to the arrangement of resistors and capacitors the positive feedback signal is subjected to a phase shift. The amount of phase shift is determined by the values of resistor 12, and capacitor 13, and by the value of a resistor 17 connected from the control electrode 15 to a point of reference potential, conventionally represented by a ground symbol, and the value of a variable capacitor 18. Capacitor 18 is connected between control electrode 15 of device 1 and control electrode 19 of device 2.

Capacitor 16 serves as a neutralizing capacitance for the stray capacitance between the connections to control electrode 15 and ground. In the absence of capacitor 16, this stray capacitance would limit the frequency range available at any one value of resistor 12 and of resistor 17.

As mentioned above, the devices 1, 2 are in push-pull arrangement and the signals on control electrodes 15 and 19 are, accordingly, of opposite phase. The effect of capacitor 18 at control electrode 15, insofar as the amount of phase shift in the feedback circuit is concerned, is substantially equivalent to that of a capacitor of twice the capacitance value connected from control electrode 15 to ground. Capacitor 18, accordingly, takes the place of two variable capacitors of twice the same maximum capacitance connected individually from control electrodes 15 and 19, to ground, respectively.

It will be understood that while resistors 12 and 17 are referred to above as though they were single resistance elements, resistor 12 may comprise, for example, three separate resistance elements connectable in parallel by a switch 20, and resistor 17 may similarly comprise three separate resistance branches connectable in parallel by a switch 21, both as shown in the drawing. As thus shown, selection of appropriate values of resistors 12 and 17 for different frequency ranges is facilitated. In order to obtain exactly the correct values of resistance for each switch setting, it may be convenient to form each branch of each resistor 12 and 17 of two or more resistance elements as indicated in the drawing for resistor 17. It will be necessary that the resistance values in the two channels be very nearly the same to insure balanced push-pull operation, and this requirement, as well as the obtaining of correct ranges for each switch setting, will be facilitated if one of the elements in each branch is of much lower resistance than the other, to permit close adjustment of the desired total resistance of each branch by substituting elements of different values for the lower resistance element of the branch. It may be desired to insert in series or in shunt in one or more of the branches a variable or adjustable resistance element proportioned to provide a very fine adjustment of the value for the branch.

The phase shift of the regenerative feedback path or network described, which comprises two arms of the Wien bridge network, is dependent upon the frequency involved, and oscillation occurs at that frequency at which the net phase shift from control electrode 15 through devices 1 and 3 and through the network back to control electrode 15 is exactly 360 degrees. It will be understood that a positive-going signal at control electrode 15 of device 1 will produce a negative-going signal on anode 22, and that this negative-going signal is supplied through coupling capacitor 23 to control electrode 24 of device 3 to produce a positive-going signal on anode 11. This signal is then supplied back to the control electrode 15 through capacitor 14 and the bridge arm comprising resistor 12 and capacitor 13. The amount of phase shift is controlled approximately equally by the values of capacitor 18 and resistor 17, and by the values of capacitor 13 and resistor 12. Other components may slightly affect the phase shift, but this effect is usually negligible because of the large amount of degeneration or negative feedback present in the circuit shown. The frequency of oscillations will be such that the net effect of all of the phase shifts from the control electrode 15 through devices 1 and 3 and the bridge arm 12, 13 back to the control electrode is exactly 360 degrees. It will be seen that suitable adjustments of the values of capacitors 13 and 18, and resistors 12 and 17, may be accomplished whereby the phase of the signal furnished through capacitor 14 may be shifted more or less as necessary to compensate for any small stray phase shifts which may occur in the resistance-capacitance coupling circuits and the like.

The regenerative feedback frequency-controlling network of the bridge as described above comprises an arm from capacitor 14 to control electrode 15, and an arm from control electrode 15 to ground, this latter arm also including an effective capictance provided by capacitor 18. The degenerative network portion of the bridge circuit comprises a resistor 28 and parallel connected capacitor 29 connected from the coupling capacitor 14 to the cathode 30 of discharge device 1, and a non-linear impedance element 31 and self-biasing cathode resistor 32 series connected from cathode 30 to ground. Resistor 32 is common to the bridge circuits of the two oscillator channels and tends to balance the currents and voltages appearing in the circuits associated with devices 1 and 2 respectively. Capacitor 29 is provided in circuit between anode 11 of device 3 and cathode 30 of device 1 to neutralize the cathode-to-ground capacitances of device 1 to prevent spurious phase shifts at this part of the circuit.

Non-linear impedance element 31, which comprises in the embodiment herein described a small incandescent lamp of which the filament resistance increases with an increase in current and decreases with a decrease in current, provides automatic regulation of the intensity of oscillations. Thus if the oscillation intensity tends to increase, the current through device 1 increases, increasing the degenerative self bias provided by non-linear impedance element 31 more than in proportion to the increase in current. Furthermore, when the impedance of element 31 increases, a greater portion of the negative feedback voltage applied to resistor 28 and capacitor 29 appears across impedance element 31, and the negative feedback from this source is thus also increased.

The bridge circuit comprising discharge devices 2 and 4 is similar to that described for devices 1 and 3. The regenerative network of the bridge comprises a resistor 33 and variable capacitor 34 connected in series, and a parallel neutralizing capacitor 35, to provide the signal from the anode 36 of device 4, through coupling capacitor 37, to the control electrode 19 of device 2, and a resistor 38 connected from control electrode 19 to ground. Variable capacitor 18 provides to control electrode 19 an effective capacitance to ground in shunt with resistor 38, since the end of capacitor 18 connected to control electrode 15 of device 1 is maintained at a voltage equal and opposite in phase to the voltage of control electrode 19. The effective capacitance to ground thus furnished to control electrode 19 is twice the value of the capacitance 18.

Since capacitor 18, with capacitors 13 and 34, comprises a main tuning control, the saving in size and cost through the arrangement described, wherein capacitor 18 is equal in effectiveness to two separate capacitors of twice the maximum value, is substantial. It will be further understood that while capacitor 13 must track accurately with capacitor 34, capacitor 18 which is preferably ganged with capacitors 13 and 34 need only approximately track therewith, having at all times approximately one half the value of capacitor 13 or 34. The reduction in tracking difficulty is, accordingly, also substantial.

The anode circuit of device 2, which includes a load resistor 39, and a coupling capacitor 40 connected to control electrode 41 of device 4, is similar to that for device 1. The control electrode leak resistor 42 for device 4 is connected, together with leak resistor 26 of device 3, to a tap on a voltage divider network comprising resistors 43 and 44 in series between a source of positive potential and ground. The resulting positive bias on devices 3 and 4 permits the use of a high resistance value for cathode biasing resistor 45, common to devices 3 and 4, whereby a large amount of degeneration is provided to maintain the balanced condition of the signals of the two oscillator channels and to provide minimum distortion in each. Anode load resistor 45′ is conveniently made variable to permit a balancing adjustment further to insure balanced amplification in the devices 3 and 4.

The negative feedback network of the bridge associated with devices 2 and 4 comprises, as one arm, a resistor 46 and parallel-connected neutralizing capacitor 47, to neutralize the capacitance to ground of cathode 48, connected to provide a portion of the signal from coupling capacitor 37 to the cathode 48 of device 2, and as the other arm, the non-linear impedance element 49 and the cathode resistor 32. It will be seen that resistor 32 is common to the cathode circuits of devices 1 and 2 and is not bypassed. This arrangement is important in overcoming any tendency toward oscillation in a push-push mode and in reducing amplification of any push-push signal components.

A push-pull signal appears across the positive feedback networks, and this signal is applied to the push-pull connected input winding 50 of transformer 5 by connections from a terminal of each of capacitors 14 and 37 through isolating resistors 51 and 52, respectively, and resistors 53 and 54, to the transformer winding. A shunting resistor, comprising at least a variable portion 55, is connected from the juncture of resistors 51 and 53 to the juncture of resistors 52 and 54 to adjust or vary the signal intensity as applied to the transformer winding 50. The secondary winding 56 of the transformer is shunted by a potentiometer resistor 57 having a slider arranged for unicontrol with variable resistor 55 through the medium of an output level control arrangement of any convenient type, designated conventionally as device 58 in the drawing. These controls are so arranged as to provide proper impedance matching at any adjustable selected volume level. An additional fixed resistor 59 may be found necessary connected in shunt to winding 56 to secure best frequency response characteristic in transformer 50.

The secondary winding 56 of transformer 5 is single-ended, rather than push-pull, to simplify the problem of applying negative feedback from the output side of transformer 10 to the input of the amplifier comprising discharge devices 6, 7, 8, 9, this feedback being important in securing low distortion over this portion of the circuit.

An adjustable portion of the signal voltage appearing across winding 56 is supplied from the slider of potentiometer 57 to the control electrode 60 of device 6 and appears after amplification by the device on anode 61 thereof, shifted in phase by 180 degrees. A predetermined portion of this amplified signal is derived from the juncture of resistors 62 and 63 and applied to the control electrode 64 of device 7. Resistors 62 and 63 are proportioned to provide a portion of the amplified signal equal to the reciprocal of the amplification factor of device 6, whereby the signal applied to control electrode 64 is equal in magnitude, but opposite in phase, to the signal appearing on control electrode 60 of device 6. Devices 6 and 7 are similar to each other and are connected to amplify the signals applied thereto by equal amounts, thereby to provide a push-pull signal to the control electrodes of devices 8 and 9, which in turn amplify this signal and excite the balanced push-pull primary winding of output transformer 10. Inverse feedback is provided from a secondary winding 65 of transformer 10 to the cathode of device 6 to improve the linearity and reduce distortion in the amplifier comprising devices 6, 7, 8 and 9. Single ended output from the oscillator is available at terminals 66 to which a pair of parallel connected secondary windings of the transformer 10 are connected. Push-pull output may be obtained if desired by connections to jacks 67 and 68, one circuit of each of which is connected to a respective one of terminals 66, and the other to ground.

Positive operating potentials are provided from a rectifier power supply 69 which comprises two separate filtering and decoupling circuits 70 and 71, arranged to supply power to respective portions of the oscillator without feedback from one to the other such portion. Stability of operation is improved by the provision of a voltage dropping resistor 72 and voltage regulator tube 73 arranged to slupply a closely controlled potential to the screen electrodes 74 and 75 of devices 1 and 2 respectively. Voltage regulator tube 73 in the screen electrode supply circuit for devices 1 and 2 serves to maintain constant average cathode current of devices 1, 2, and the current value so maintained is established as that providing maximum controlling effect of non-linear impedance elements 31 and 49. Overall stability of the oscillator is improved, and the amplitude of oscillations is substantially constant even with substantial variations of input power line voltage and of direct current operating potentials. The regulator tube 73, accordingly, maintains maximum effectiveness of the amplitude stabilizing elements 31 and 49.

The oscillator stability, and the low distortion characteristics of the oscillator described, are due in large part to the coupling provided between the two channels or halves of the equipment. This coupling is provided through the use of the unbypassed common impedance 32 in the degenerative feedback networks of the Wien bridge circuits; through the use of the unbypassed common impedance 45 in the cathode circuits of devices 3 and 4, the impedance being, therefore, in the amplifying path interposed between the devices 1 and 2, respectively, and the respective points in the Wien bridge circuits from which the positive and negative feedback signals for these two devices are taken, these points being at the coupling capacitors 14 and 37, respectively; and through the use of an unbypassed common impedance 76 in the screen electrode positive potential supply connection for devices 3 and 4. It will be seen in the drawing that devices 1, 2, 3 and 4 are each of the type commonly known as pentodes, comprising a cathode, control electrode, screen electrode, suppressor grid electrode and anode. Devices 1 and 2, and devices 3 and 4, should be respectively alike and as closely matched in characteristics as practicable to maintain as nearly equal or balanced characteristics in the two channels of the oscillator as possible, but it is not essential, though it is desirable, that they be pentode devices, since triode or other amplifier devices may be employed.

It is not essential to the proper operation of the oscillator that neutralizing capacitors 16 and 35 in the regenerative feedback networks and capacitors 29 and 47 in the degenerative feedback networks be provided, and they may be omitted if desired. Alternatively, these capacitors may be made adjustable to provide trimming or balancing of the oscillator channels and slight adjustments to provide proper neutralization.

Adjustable trimmer capacitors are shown in shunt with tuning capacitors 13 and 34 to permit equalization or balancing of the values of these tuning capacitors. A trimming capacitor is also provided for tuning capacitor 18, and adjustments of this trimming capacitor alone, or together with adjustments of the trimming capacitors for capacitors 13 and 34, may be desirable to adjust the frequency of oscillations to conform to the dial markings of the main tuning control 77 arranged to vary ganged capacitors 13, 18 and 34.

The action of non-linear impedance devices 31 and 49 inherently causes some signal distortion since the response of such devices to a change in current therethrough is sufficiently rapid that the impedances thereof change during a single half-cycle of the oscillator voltage. This distortion is primarily second harmonic distortion and is almost completely eliminated by the balancing arrangements of the oscillator as described. The total distortion at the output of an oscillator according to the disclosure has been found to be, for example, less than one-tenth of one percent in a typical physical embodiment and the total output power at transformer 10 about 650 milliwatts.

While I have shown only certain preferred embodiments of my invention by way of illustration, many modifications will occur to those skilled in the art and I therefore wish to have it understood that I intend, in the appended claims, to cover all such modifications as fall within the true spirit and scope of my invention.

What I claim as new and desire to secure by Letters Patent of the United States is:

1. An oscillator comprising two balanced amplifier channels in push-pull arrangement, each said channel comprising two electron discharge devices connected in cascade, substantially non-inductive regenerative feedback means and degenerative feedback means coupling the output circuit of the second of said devices to the input circuit of the first of said devices in each said channel, a portion of said degenerative feedback means being a cathode impedance common to both said channels to minimize amplification in said channels of push-push signal components, and a variable tuning capacitor connected from a point in one of said regenerative feedback means to a corresponding point in said other regenerative feedback means at which the signal voltage is equal in magnitude and opposite in phase to the signal voltage at said first point.

2. In an oscillation generator, two channels connected for push-pull operation, each said channel comprising at least two electron discharge devices connected in cascade amplifying arrangement, a regenerative substantially non-inductive feedback path from the second to the first of said devices to sustain oscillation therein, and a degenerative feedback path from said second to said first device comprising a non-linear impedance variable in response to variations in the amplitude of oscillatory current of said generator tending to maintain constant said amplitude and an impedance element common to said two channels, said impedance element being connected in the cathode circuits of said first devices and arranged to tend to prevent push-push operation of said channels, and a variable capacitor connected between a point in the regenerative feedback path of one said channel at which an oscillatory voltage occurs and a corresponding point in the feedback path of the other channel at which the occurring voltage is substantially equal to and in phase opposition to the voltage at said first point.

3. In an oscillation generator, two channels connected for push-pull operation, each said channel comprising at least two electron discharge devices connected in cascade amplifying arrangement, a regenerative substantially non-inductive feedback path from the second to the first of said devices to sustain oscillation thereof, and a degenerative feedback path from said second to said first device comprising a non-linear impedance variable in response to variations in the amplitude of oscillatory current of said generator tending to maintain constant said amplitude and an impedance element common to said two channels, a second impedance element connected degeneratively in circuit with the cathode of said second device in common in each said channel, said impedance elements being arranged to tend to prevent push-push operation of said channels, and a variable capacitor connected between a point in the regenerative feedback path of one said channel at which an oscillatory voltage occurs and a corresponding point in the feedback path of the other channel at which the occurring voltage is substantially equal to and in phase opposition to the voltage at said first point.

4. In an oscillation generator, two channels connected for push-pull operation, each said channel comprising at least two electron discharge devices connected in cascade amplifying arrangement, a regenerative substantially non-inductive feedback path from the second to the first of said devices to sustain oscillation therein, and a degenerative feedback path from said second to said first device comprising a non-linear impedance variable in response to variations in the amplitude of oscillatory current of said generator tending to maintain constant said amplitude and an impedance element common to said two channels, said impedance element being connected in the cathode circuits of said first devices and arranged to tend to prevent push-push operation of said channels, a variable capacitor connected between a point in the regenerative feedback path of one said channel at which an oscillatory voltage occurs and a corresponding point in the feedback path of the other channel at which the occurring voltage is substantially equal to and in phase opposition to the voltage at said first point, said first device in each said channel comprising a screen electrode, and means to maintain a constant potential on said screen electrodes to minimize changes in the average current passing through said variable impedance in each said channel.

5. An oscillator comprising two balanced channels in push-pull arrangement, each of said channels comprising in cascade first and second electron discharge devices each having at least an anode, a cathode and a control electrode, coupling means connecting the anode of said first device to the control electrode of said second device, an electrical network including a substantially non-inductive positive feedback path from the anode of said second device to the control electrode of said first device and a substantially non-inductive negative feedback path from the anode of said second device to the cathode of said first device, a center-tapped resistance network connected between the respective control electrodes of said first devices in the two channels, a variable capacitor connected in parallel with said resistance network, and cathode circuits respectively connecting the cathodes of said devices to the center tap of said resistance network.

6. An oscillator as in claim 5 in which the cathode circuits of said first devices contain a common impedance.

7. An oscillator as in claim 5 in which the cathode circuits of said second devices contain a common impedance.

8. An oscillator as in claim 5 in which the cathode circuits of said first devices each contain a non-linear impedance having a characteristic such that the impedance value increases with increased current therethrough, the cathode circuits of said first devices include a common impedance, and the cathode circuits of said second devices include a common impedance.

9. An oscillator as in claim 7 having means to apply a substantially constant positive bias voltage to the control electrodes of said second devices.

10. An oscillator as in claim 8 in which each of said devices has a screen electrode, having means to apply a regulated constant voltage to the screen electrodes of said first devices, and means to apply a substantially constant bias voltage to the control electrodes of said second devices.

CHARLES W. CLAPP.

REFERENCES CITED

The following references are of record in the file of this patent:

UNITED STATES PATENTS

| Number | Name | Date |
|---|---|---|
| 2,268,872 | Hewlett | Jan. 6, 1942 |
| 2,462,903 | Romander | Mar. 1, 1949 |